United States Patent [19]

Hester et al.

[11] Patent Number: 4,803,462
[45] Date of Patent: Feb. 7, 1989

[54] CHARGE REDISTRIBUTION A/D CONVERTER WITH INCREASED COMMON MODE REJECTION

[75] Inventors: Richard K. Hester, Whitewright; Michiel de Wit, Dallas, both of Tex.

[73] Assignee: Texas Instruments Incorporated, Dallas, Tex.

[21] Appl. No.: 84,276

[22] Filed: Aug. 11, 1987

[51] Int. Cl.$^4$ ............................................... H03M 1/38
[52] U.S. Cl. ..................................... 341/172; 307/243
[58] Field of Search .... 340/347 AD, 347 M, 347 NT; 307/243

[56] References Cited

U.S. PATENT DOCUMENTS

| | | | |
|---|---|---|---|
| 3,526,888 | 9/1970 | Knox et al. | 340/347 NT |
| 3,940,759 | 2/1976 | Zitelli et al. | 340/347 CC X |
| 4,410,880 | 10/1983 | Zaborowski | 340/347 DA |
| 4,661,802 | 4/1987 | Yukawa | 340/347 DA |

Primary Examiner—T. J. Sloyan
Attorney, Agent, or Firm—Stanton C. Braden; James T. Comfort; Melvin Sharp

[57] ABSTRACT

An A/D converter includes a positive array of binary weighted capacitors with a common top plate (12) and a negative array of binary weighted capacitors with a common top plate (32). The positive and negative arrays are input to a differential amplifier (10) for measuring the differential voltage across the top plates. During the sample time, a differential input voltage is sampled on the bottom plates of the capacitors and the top plates of the capacitors are disposed at the common mode voltage of the input signal. This limits the input voltage across the capacitors to one-half the differential voltages of the input signal. During the hold mode and the redistribution mode, this presents a predetermined common mode input voltage to the amplifier (10) which is independent of the input signal.

24 Claims, 4 Drawing Sheets

CHARGE REDISTRIBUTION A/D CONVERTER WITH INCREASED COMMON MODE REJECTION

CROSS-REFERENCE TO RELATED APPLICATIONS

The present invention is related to U.S. Pat. application Ser. No. 084,277, filed Aug. 11, 1987.

TECHNICAL FIELD OF THE INVENTION

The present invention pertains in general to A/D converters, and more particularly, to charge redistribution A/D converters utilizing input differential signals.

BACKGROUND OF THE INVENTION

Analog-to-digital and digital-to-analog converters have been described in the past utilizing a simple solution that is based on the periodic charging and discharging of a capacitor. These are sometimes referred to as the Shannon-Rack decoders. These types of decoders employ a constant current source that is utilized to charge a capacitor through a switch. For the digital-to-analog conversion, the output on the capacitor, after a number of switching cycles, represents the analog value. A clock is necessary to synchronize the operation of the decoder in conjunction with the binary input. A weighting factor is provided during each interval of time that the capacitor is charged and discharged to ensure that the capacitor voltage is halved each half-period through discharging. Due to practical problems such as timing and the need of high precision and low-draft components, as well as a serial digital input, such a converter has never been widely utilized.

A modern version of the concept of charge weighting used in the Shannon-Rack decoder which is tailored for monolithic integration is the concept of a charge redistribution decoder. In this decoder, intermediate results are stored dynamically with minimum losses on high-precision capacitors (e.g., MOS capacitors), and are moved from one capacitor to another by MOSFET switches. One of the more widely utilized charge redistribution converter techniques is that based on successive approximation. This technique primarily utilizes capacitors having binary weighted values with the top plate of all the capacitors connected to one input of a comparator and the bottom plate switched between various voltages. The steering of the various switches is controlled by the comparator through auxiliary logic circuitry.

The conversion process is essentially performed in three steps, a sampling step, a hold step and a conversion step. In the sampling step, the top plates of the capacitors are normally connected to ground or some suitable sample reference voltage, and the bottom plates to the input voltage. This results in a stored voltage on the bottom plate which is proportional to the input voltage. In the hold step, the top plate is electrically isolated and the bottom plates are normally connected to ground or some suitable hold reference voltage. Since the charge on the top plate is conserved, it's potential goes to the negative of the input voltage. In the conversion or "redistribution" step, each individual bit is tested by sequentially connecting the bottom plate of each of the capacitors to either a redistribution reference voltage or to ground until the voltage on the top plate reaches a predetermined voltage. This is usually the trip point of the comparator.

Charge redistribution converters have also been designed utilizing a differential configuration with a positive and a negative array of capacitors connected to the differential input of a comparator. This provides a fully differential charge redistribution A/D converter which accommodates input differential signals and provides increased supply noise rejection and noise performance. However, one disadvantage of the fully differential architecture is that the common mode input voltage can be relatively high, which voltage is impressed at both the positive and negative inputs of the comparator. The output of the comparator is sensitive only to the differential voltage. As a result, the input differential signals accommodated by the differential architecture are usually less than the supply voltage, in addition to the input common mode range also being less than the supply voltage.

Operation of the comparator at various common mode voltages can result in a variation in offset error in the analog-to-digital conversion. Normally, the offset voltage of the comparator is manifested as an offset error in the conversion. This, of course, can be compensated for by various techniques. However, if the offset error is a function of a common mode input voltage, which is normally the case with conventional comparators, this will result in an error due to the common mode input voltage. Therefore, there exists a need for a circuit which minimizes the amount of error in the conversion process and the limitations of input voltage swings due to the value of the common mode input voltage.

SUMMARY OF THE INVENTION

The present invention disclosed herein comprises a differential analog-to-digital converter. The A/D converter includes positive and negative arrays of binary weighted capacitors which have the top plates thereof connected to the differential input of a comparator. A differential input voltage is sampled across the capacitors such that the top plates of the capacitors have a differential voltage impressed therebetween that is proportional to the analog differential input voltage. The common mode voltage of this input voltage is then shifted to a predetermined value that is independent of the input signal voltage. The charge on the capacitors is then redistributed in accordance with a successive approximation technique.

In another embodiment of the present invention, the differential input voltage is sampled onto the bottom plates of the capacitors and the common mode voltage of the differential input signal is measured and applied to the top plates of the capacitors. The bottom plates of the capacitors are then connected to a reference voltage to shift the common mode voltage across the top plates of the capacitors to a predetermined common mode reference voltage. This common mode reference voltage is independent of the differential input voltage.

In yet another embodiment of the present invention, the common mode input voltage is set to a voltage other than ground such that the bottom plates of the capacitors can be varied between a zero reference voltage and a positive reference voltage. This allows the full reference voltage to be applied across each capacitor during testing of the bits in accordance with the successive approximation technique. This provides for larger steps when testing the least significant bits.

In yet a further embodiment of the present invention, the top plates of the capacitors are disconnected from the differential input to the comparator during the sampling step. The differential inputs to the comparator are then set to a predetermined reference voltage during the sampling time. After sampling and after the common mode voltage associated with the differential voltage across the top plates of the capacitors is disposed at the final common mode input voltage, the top plates of the capacitors are connected to the differential input of the comparator and then the charge redistributed among the capacitors.

A technical advantage is provided by the present invention in that the redistribution of charge about the capacitors is performed with the common mode input voltage to the comparator disposed at a predetermined reference voltage. This predetermined common mode input voltage is independent of the common mode levels of the differential input voltage. This allows the comparator to always operate at a predetermined common mode input. A further technical advantage is provided in that input common-mode voltage swings incurred during sampling of the input voltage signal are inhibited from being translated to the input of the comparator. This therefore limits the maximum voltage swing which can be presented to the input of the comparator, thus reducing any offset errors that would have occurred as a result of the large input common-mode voltage swings. A yet further technical advantage of the present invention is provided by allowing the bottom plates of the capacitors to be connected between a zero reference voltage and a positive reference voltage to allow the full reference voltage to be applied to the bottom plates of the capacitor during redistribution of the charge.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
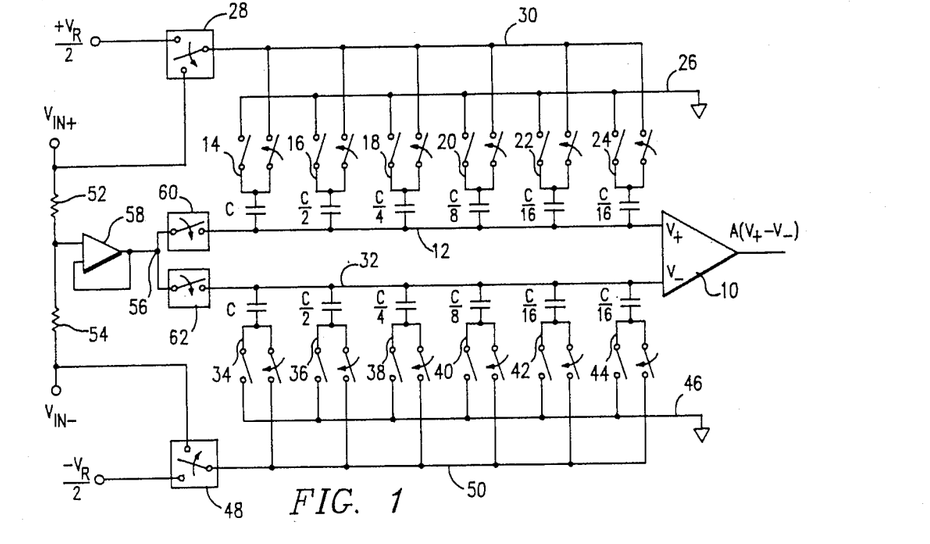
FIG. 1 illustrates a schematic diagram of one embodiment of a differential A/D converter of the present invention in the sampling mode.

Referring now to FIG. 1, there is illustrated a schematic diagram of a fully differential charge redistribution Analog-to-Digital converter (A/D) utilizing the present invention. The A/D converter is comprised of a differential amplifier 10 having a positive input $V_+$ and a negative input $V_-$. The $V_+$ input of amplifier 10 is connected to a positive array of binary weighted capacitors and the $V_-$ input is connected to a negative array of binary weighted capacitors. By way of example, a five bit A/D converter will be described.

The positive and negative arrays are each fabricated of capacitors having binary weighted values, i.e., $C$, $C/2$, ..., $C/2^{n-1}$. There are two capacitors having the value of $C/2^{n-1}$ so that the total capacitance of the $n+1$ capacitors is $2C$. In the five bit example, the capacitors are valued at $C$, $C/2$, $C/4$, ..., $C/16$.

Each of the capacitors in the positive array is connected to a common top plate 12 with the bottom plates of each of the capacitors $C$, $C/2$, ..., $C/8$, $C/16$, connected to two input switches 14, 16, 18, 20, 22 and 24, respectively. Top plate 12 is connected to the $V_+$ input of amplifier 10. Each of the switches 14–24 is operable to be connected on one side to ground through a line 26 or to the input of a switch 28 through line 30. Switch 28 is operable to be connected to the voltage $+V_{R/2}$ or to $V_{IN+}$.

In a similar manner, the top plates of the capacitors $C/2$, ..., $C/16$ of the negative array are connected to a common top plate 32 with the bottom plates being connected to switches 34, 36, 38, 40, 42 and 44, respectively. Bottom plate 32 is connected to the $V_-$ input of amplifier 10. Switches 34–44 are similar to switches 14–24. Switches 34–44 are operable to be connected to either a ground line 46 or to one input of a switch 48 through line 50. Switch 48 is operable to be connected to either a voltage $-V_{R/2}$ or the input voltage $V_{IN-}$.

The differential input voltage defined between the $V_{IN+}$ terminal and the $V_{IN-}$ terminal is impressed across two series connected resistors 52 and 54. Resistors 52 and 54 are connected as voltage dividers with the values thereof being equal to provide a value at the junction thereof equal to the input common-mode voltage, $V_{ICM}$. This voltage is input to a node 56 through a unity gain amplifier 58. The amplifier 58 acts merely as a buffer which is optional. The node 56 is connected through a switch 60 to the top plate 12 in the positive array and through a switch 62 to the top plate 32 of the negative array. Switches 60 and 62 are selectively operable to be opened or closed.

The conversion process is performed in three steps. The first step comprises a "sampling mode", the second step comprises a "hold mode" and the third step comprises a "redistribution mode". The switches in the circuit of FIG. 1 are illustrated in the sampling mode. In this mode, the top plates 12 and 32 are each connected to node 56 through switches 60 and 62. The bottom plates of the capacitors in the positive array are connected to the line 30 through switches 14–24, with line 30 being connected to the $V_{IN+}$ terminal through switch 28. The bottom plate of the capacitors in the negative array are connected through switches 34–44 to the line 50, line 50 being connected to the $V_{IN-}$ input terminal through switch 48. This results in the bottom plate of the capacitors in the positive array being disposed at the voltage $V_{IN+}$ and the bottom plates in the capacitors in the negative array being connected to the voltage $V_{IN-}$. The top plates 12 and 32 of the capacitors in the positive and negative arrays, respectively, are connected to the input signal common mode voltage $V_{ICM}$. Therefore, in the sampling mode, the voltage on the upper plates 12 and 32 of the positive and negative array, respectively, is equal to the input signal common mode voltage. This results in a voltage across the capacitors in the positive array of $-\frac{1}{2}V_D$ and a voltage across the capacitors in the negative array of $+\frac{1}{2}V_D$.

Figure 2:
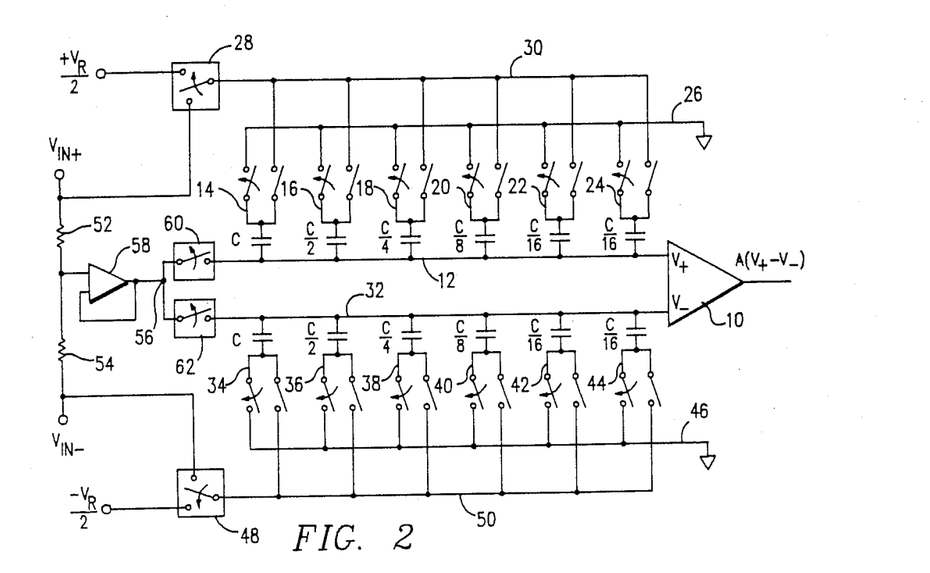
FIG. 2 illustrates the A/D converter of FIG. 1 in the hold mode.

In the "hold mode", switches 60 and 62 are opened and switches 14-24 connected to the ground line 26 to place the bottom plates of the capacitors in the positive array at ground, and switches 34-44 connected to the ground line 46 to connect the bottom plates of the capacitors in the negative array at ground. This configuration is illustrated in FIG. 2. Switches 28 and 48 are connected to the voltages $+V_{R/2}$ and $-V_{R/2}$, respectively. In the case of no leakage, the charge on the capacitors in the positive array remains constant such that the voltage across the capacitors in the positive array is equal to $\frac{1}{2}V_D$ resulting in a voltage at the positive input of amplifier 10 of:

$$V_+ = -\tfrac{1}{2}V_D$$

In a similar manner, the voltage on the input to the negative input of amplifier 10 is equal to:

$$V_- = +\tfrac{1}{2}V_D$$

The output of the amplifier 10 of gain A is equal to:

$$V_{OUT} = A(V_+ - V_-) = A(V_D)$$

Although the present example utilizes a reference output of zero volts from the amplifier 10, the reference voltage can be disposed midway between the supply voltage and ground, as will be described in a further embodiment hereinbelow.

Figure 3:
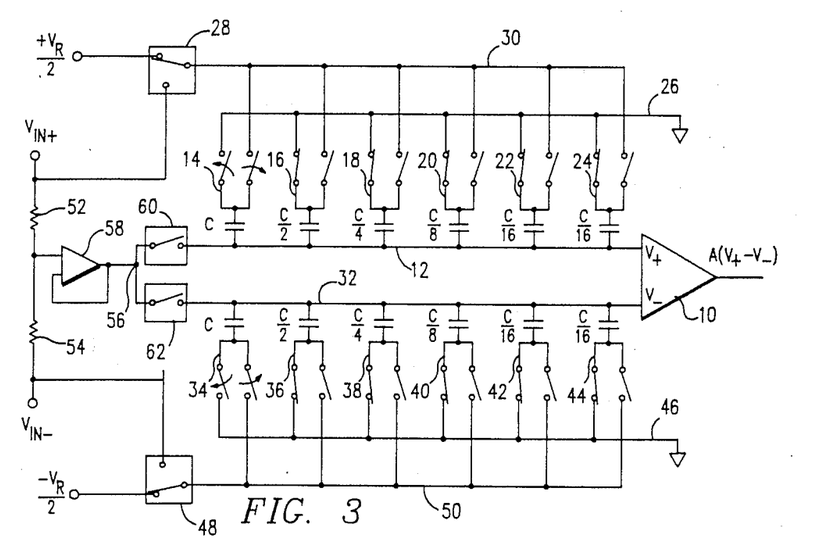
FIG. 3 illustrates the A/D converter of FIG. 1 in the redistribution mode wherein the MSB bit is being tested.

In the "redistribution mode", as illustrated in FIG. 3, switches 28 and 48 are connected to the voltages $+V_{R/2}$ and $-V_{R/2}$, respectively, and the value of each of the bits is tested, beginning with the value of the most significant bit (MSB). This testing is done by raising the bottom plate of the largest capacitor to the respective reference voltage $+V_{R/2}$ or $-V_{R/2}$. The equivalent circuit will then be a voltage divider between two equal capacitances. The voltage on the V+ terminal will then be increased by a value of $V_{R/4}$ and the voltage on the V- will be changed by a value of $-V_{R/4}$ as follows:

$$V_+ = -\tfrac{1}{2}V_D + V_{R/4}$$

$$V_- = +\tfrac{1}{2}V_D - V_{R/4}$$

The output voltage will then be:

$$A(-V_D + V_{R/2})$$

By sensing the output of the amplifier 10, a determination will be made whether the output is above a value of zero, which corresponds to a logic "1" and below zero if the output is a logic "O". If it is above a zero, this will indicate that the MSB=O and, if it is below zero, this will indicate that the MSB=1. The output of the amplifier 10 is, therefore, the inverse value of the binary bit being tested. The switches 14 and 34 corresponding to the MSB bits are then returned to ground only if the MSB is a zero. In a similar manner, the next MSB is determined by raising the bottom plate of the next largest capacitor to the respective reference voltages $+V_{R/2}$ or $-V_{R/2}$ through switches 16 and 36 and then checking the polarity of the resulting value on the output of the amplifier 10. This is a conventional successive approximation function which requires a digital control to sequentially close the switches and make a determination as to the level of the output voltage on amplifier 10. It should be noted that the switches illustrated in FIGURES 1-3 can be implemented with MOS or CMOS pass transistors.

For each capacitor having the bottom plate raised from ground to the associated voltage $+V_{R/2}$ or $-V_{R/2}$, there will be a corresponding change in the voltage on the upper plate which is proportional to the voltage across the capacitor and ratio of that capacitor to the total capacitance. Initially, the differential voltage on the input of amplifier 10 is equal to the $-V_D$. By switching the bottom plates of the capacitors, this differential voltage can be increased toward zero. However, if switching of a capacitor increases the differential voltage above zero, this indicates that the associated bit should be a logic "O" and the bottom plate is returned to ground. Each capacitor is successively switched to the reference voltage until the differential voltage on the input of amplifier 10 is equal to zero without exceeding the value of zero. Any capacitor that causes the value to exceed zero has the bottom plate reconnected to ground, as described above. It is important to note that the common mode input voltage to the comparator, which is the average of the voltage on the two plates 12 and 32, is equal to zero. In prior art devices, this common mode input voltage was equal to the input signal common mode input voltage. The A/D convertor of the present invention therefore redistributes the charge on the capacitors with a common mode input voltage to the amplifier 10 that is independent of the input signal.

Figure 4:
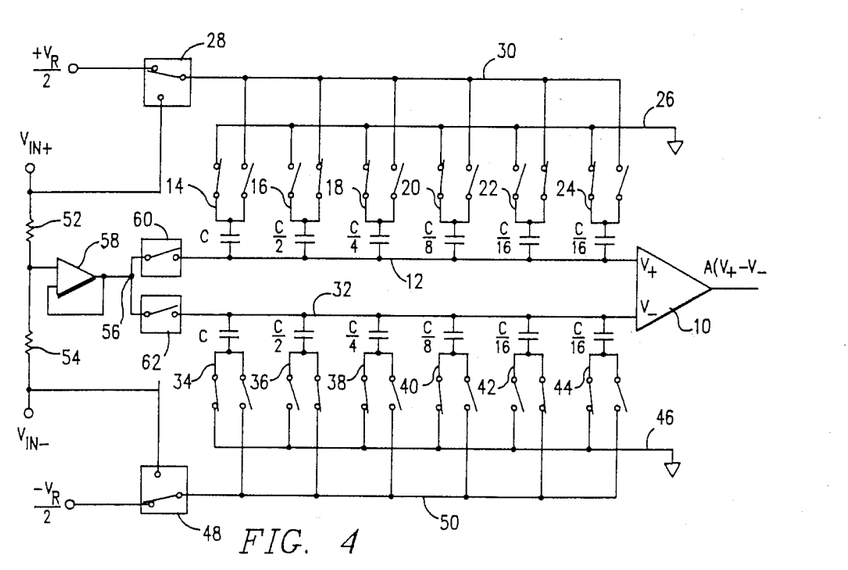
FIG. 4 illustrates the final configuration of the A/D converter of FIG. 1 after all bits have been sampled.

After all the bits have been determined and the charge redistributed, the differential voltage on the input of the amplifier 10 is equal to zero. A final configuration is illustrated in FIG. 4 for the digital output 01001. Notice that all the capacitors corresponding to the "O" bit are completely discharged. The total original charge on the top plates has been redistributed in a binary fashion and now resides only on the capacitors corresponding to a "1" bit. N redistributions are required for a conversion resolution of N bits.

Figures 5, 6, 7:
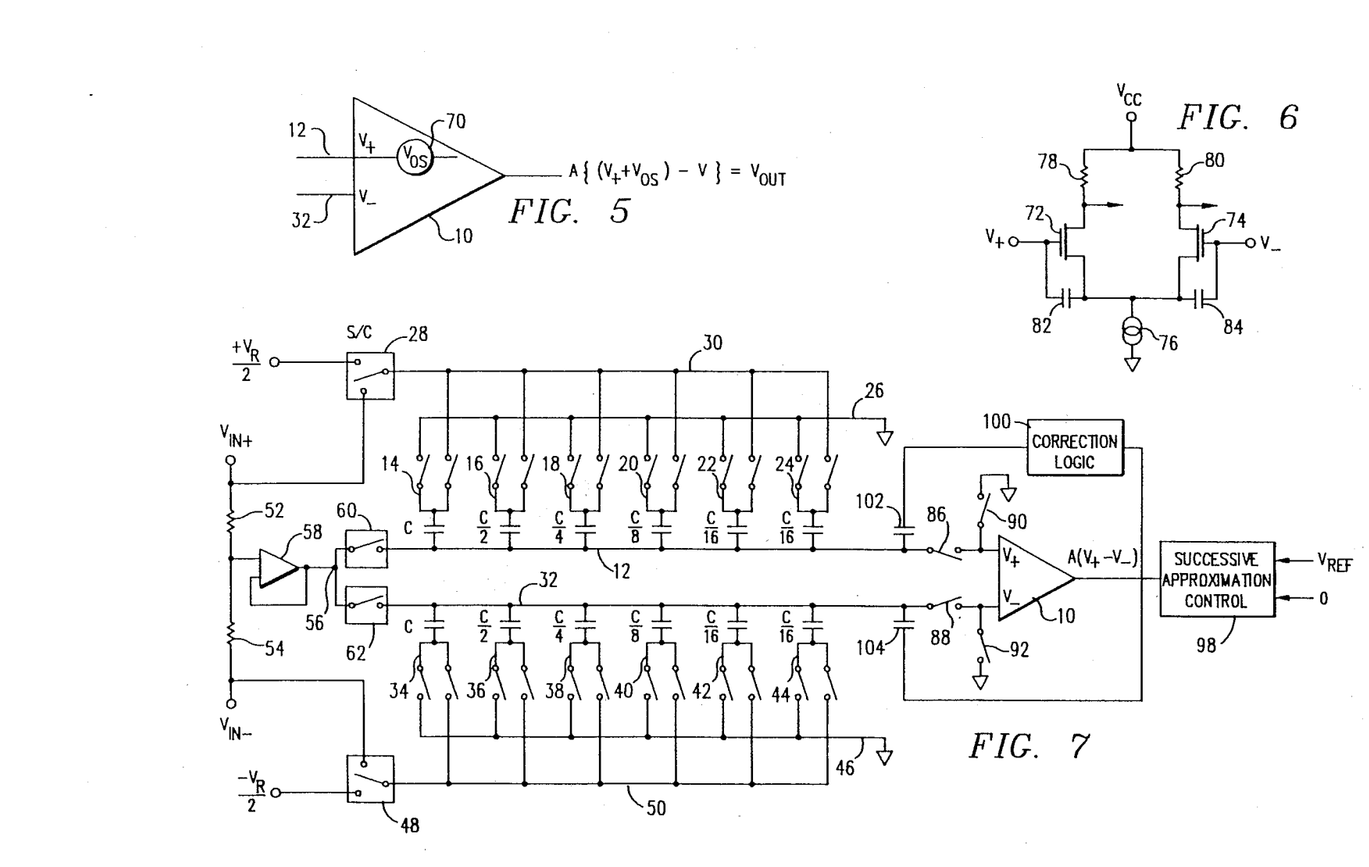
FIG. 5 illustrates a schematic diagram of the offset voltage in the comparator.
FIG. 6 illustrates a schematic diagram of the input circuitry to the comparator.
FIG. 7 illustrates an alternate embodiment of the present invention.

Referring now to FIG. 5, there is illustrated an expanded schematic diagram of the amplifier 10 illustrating the offset voltage in the amplifier. Typically, there is an offset voltage $V_{OS}$ associated with the $V_+$ input. This is represented by a voltage source 70 which is connected to the series with the $V_+$ input. This offset voltage will be summed with the $V_+$ input such that the differential voltage will be:

$$A[(V_+ + V_{OS}) - V_-] = V_{OUT}$$

This offset voltage will result in an error in the A/D conversion process. However, this error can be accounted for initially by a calibration procedure whereby a predetermined value is measured and the offset determined. This offset is then accounted for through either logic circuitry or by a counter balancing offset.

One problem that has been encountered with the offset voltage generated by the voltage source 70 is the voltage dependency of this offset voltage. The final voltage on the $V_+$ and $V_-$ inputs to the operational amplifier 10 will be equal to some common mode input voltage. In the present invention, this common mode input voltage is set equal to zero independent of the input signal. Therefore, the offset voltage will always be known. In the prior art devices, on the other hand, the common mode input voltage to the comparator 10 is the same as the common mode voltage of the input signal such that the offset voltage is a function of the input signal, resulting in an additional error consideration.

The operation of the A/D converter of FIGURES 1–4 allows the common mode input voltage to the amplifier 10 to be set at zero. This is accomplished by limiting the voltage across the capacitors in both the positive and negative arrays to one-half the differential voltage of the input signal. Thereafter, the bottom plates of the capacitors are connected to zero voltage, which naturally results in the voltage on the upper plates of the capacitors being disposed at ground. This results from the fact that the initial voltage across the capacitors was limited to the maximum of one-half the differential voltage of the input signal. This is to be compared with the prior art system wherein the voltage across the capacitors was equal to the common mode voltage of the input signal plus or minus one half of the differential voltage of the input signal.

Although the present embodiment illustrates the common mode input voltage being disposed at zero, an important aspect of the present invention is that the common mode input voltage to the amplifier can be set at a predetermined voltage as long as this predetermined voltage is independent of the input signal. Further, it is only necessary that the common mode input voltage to the amplifier 10 can be determined during the redistribution step. Therefore, circuitry could be provided to adjust the common mode voltage on the upper plates of the capacitors after sampling to a predetermined voltage.

For example, if the upper plates of the capacitor were connected to ground during sampling, this would result in the upper plates of the capacitors being disposed at a voltage equal to the common mode voltage of the input signal plus or minus one-half of the differential input signal. This common mode voltage could then be adjusted by measuring the common mode voltage of the input signal, comparing it with a desired common mode voltage to determine the difference therebetween, and then subtracting this difference from the common mode voltage of the input signal to change the common mode voltage on the upper plates to the capacitors to the desired common mode input voltage. This can be done in the hold mode or just prior to initiating the redistribution step.

Referring now to FIG. 6, there is illustrated a schematic diagram of one example of the input circuitry for the amplifier 10. The $V_+$ input is connected to the gate of a first N-channel MOS transistor 72 and the $V_-$ input is connected to the gate of a second N-channel MOS transistor 74. Transistors 72 and 74 are connected in a differential configuration with the sources thereof commonly connected to one side of a current source 76, the other side of the current source 76 connected to ground. The drain of transistor 72 is connected to one end of a resistor 78 and the drain of transistor 74 is connected to one end of a resistor 80. Resistors 78 and 80 have the other ends thereof commonly connected to the power supply $V_{CC}$. A parasitic gate-to-source capacitance 82 is associated with transistor 72 and a parasitic gate-to-source capacitance 84 is associated with transistor 74. Due to the requirements of a differential input on amplifier 10, these capacitances are relatively large, and a function of comparator input voltage, resulting in inherent errors when swinging from a high voltage to a low voltage. For a measurement of very small differential voltages, it is important that the voltage swing for a given input be limited. If the variation of capacitance as a function of a large voltage charge is not considered, this could provide an additional source of error in the A/D converter when measuring small differential voltages.

For example, in the above example, when the common mode voltage is 4 volts, both inputs $V_+$ and $V_-$ will be disposed at approximately 4 volts. Thereafter, the voltage on the upper plates of the capacitors in the positive and negative arrays is changed to zero volts. This results in a 4 volt swing from the initial voltage during sampling to the voltage during the conversion process. The common-mode input to the comparator is proportional to the change in comparator input capacitance times the input common-mode voltage. Since it is unnecessary to have this large of a voltage swing in order to redistribute the charge, it is desirable to reduce the voltage swing across the gate to source capacitances 82 and 84 on the input circuit illustrated in FIG. 6.

Referring now to FIG. 7, there is illustrated a schematic diagram of the fully differential A/D convertors of FIGS. 1–4 illustrating circuitry for both providing offset correction and also circuitry for preventing large common-mode voltage swings on the $V_+$ and $V_-$ inputs of the amplifier 10 during the sampling operation, wherein like numerals refer to like parts in the various figures. In the circuitry of FIG. 7, the upper plates 12 in the capacitors in the positive array are connected to the $V_+$ input of the amplifier 10 through a switch 86 and, in a similar manner, the upper plates 32 of the capacitors in the negative array are connected to the $V_-$ input through a switch 88. The $V_+$ terminal is also connected to ground through a switch 90 and the $V_-$ terminal is selectively connected to ground through a switch 92.

In operation, the switches 86 and 88 are open during sampling and hold to prevent the potentially large voltage swings incurred during the sample and hold steps from appearing on the input of the amplifier 10. During this period, the inputs of the amplifier 10 are connected to ground or to a different reference voltage through the switches 90 and 92. During redistribution, the switches 86 and 88 are closed and the switches 90 and 92 opened. At this time, the voltage across the $V_+$ and $V_-$ inputs of the amplifier 10 will be a maximum of one-half $V_D$ from the reference voltage to which the inputs were connected by switches 90 and 92 which, in this example, is ground.

The output of the amplifier 10 is connected to a successive approximation control circuit 98 which provides all of the controls necessary to steer the various switches associated with the A/D converter. The successive approximation control circuit 98 receives at the input thereof a reference voltage, ground and outputs the various steering logic. Correction logic 100 is also provided which is interfaced with the upper plate 12 of the capacitors in the positive array through a capacitor 102 and with the upper plate 32 of the capacitors in the negative array through a capacitor 104. The capacitors 102 and 104 provide the offset corrrection to correct for the offset voltage as discussed above. An example of both the offset correction logic and the successive approximation controls is illustrated in U.S. Pat. No. 4,299,426, issued to Kheu-Sang Tan on Aug. 16, 1983, which is incorporated herein by reference.

Figure 8:
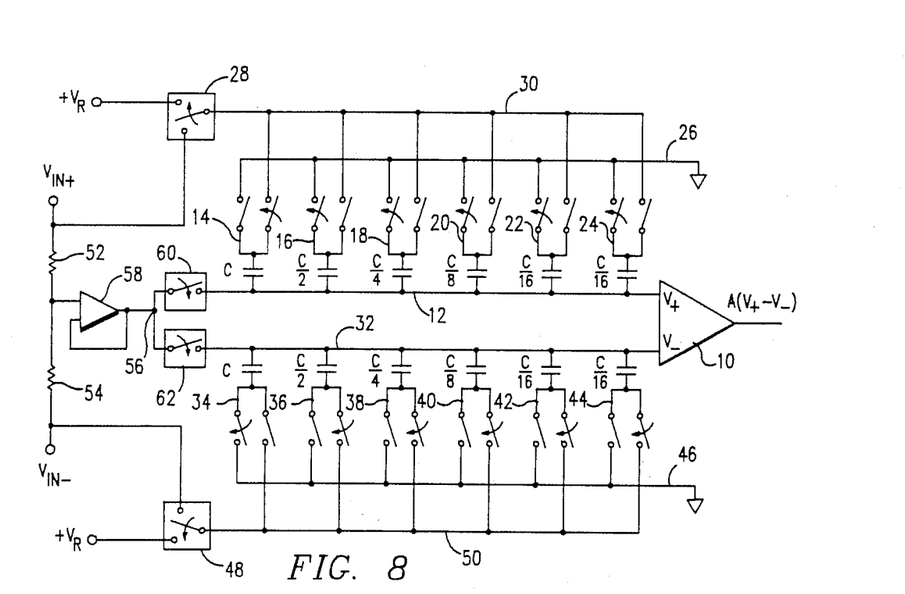
FIG. 8 illustrates an alternate embodiment of the present invention.

Referring now to FIG. 8, there is illustrated an alternate embodiment of the present invention illustrating a portion of the positive and negative capacitor arrays, wherein like numerals refer to like parts in the various figures. During the operation of the circuit, the reference voltage input to the switches 28 and 48 is connected to the voltage $V_R$ and, in the sample mode, the switches 28 and 48 are configured to connect the bottom plates of the capacitors to the voltages $V_{IN+}$ and $V_{IN-}$, similar to the operation described above in reference to FIG. 1 in the sampling mode. In this mode, switches 14–24 in the positive array and switches 34–44 in the negative array are configured similar to those in FIG. 1. In addition, the upper plates 12 and 32 are connected to the input signal common mode voltage.

In the hold mode, the switches 16–24 in the positive array are configured such that ground is connected to the lower plates of the associated capacitors and the switches 36–44 in the negative array are configured such that $V_R$ is connected to the lower plates of the associated capacitors. However, the switch 14 in the positive array associated with the capacitor C is connected to $V_R$ through the switch 28 and the switch 34 in the negative array associated with the capacitor C is connected to ground through switch 48. Since the capacitor C and the remaining capacitors in each of the arrays acts as a voltage divider, the comparator input common mode voltage will be $V_{R/2}$, and in the hold mode the top plate voltages will be:

$$V_+ = V_{R/2} - \tfrac{1}{2}V_D$$

$$V_- = V_{R/2} + \tfrac{1}{2}V_D$$

Figure 9:
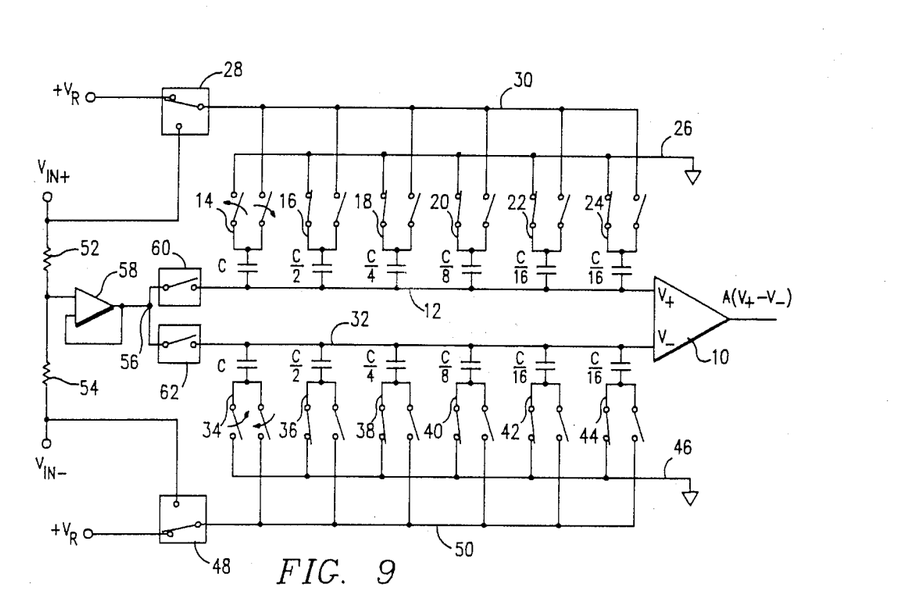
FIG. 9 illustrates redistribution of the charge on the MSB bit in the A/D converter of FIG. 8.

During the redistribution step, the first MSB is tested with the switches first in the positions indicated in FIG. 8 and then in the positions indicated in FIG. 9. With the use of the successive approximation circuitry described above, each bit is then tested and the charge distributed. By disposing the bottom plate of the MSB capacitor in both the positive and negative array at the opposite of ground or the reference voltage from the remaining capacitors in the array, it is possible to vary the voltage on the top plate in a positive or a negative direction by changing the bottom plates between a voltage of ground and the reference voltage. This is compared with the A/D converter of FIGS. 1-2 wherein only one-half of the reference voltage positive input signals can be converted. Also, using the full reference voltage allows for a larger voltage swing across the bottom plate of the capacitor during testing of the bits, therefore a larger "step" is available. This is important when testing the least significant bits (LSB), since a larger step results in more sensitivity. This allows a designer to relax the noise constraints on the comparator, which are required to maintain a certain sensitivity to small signals which exist when testing the LSBs.

Another advantage provided by the alternate embodiment of FIG. 8 is that the common mode input voltage to the amplifier 10 can be set midway between the supply voltage and ground. The amplifier 10 can then be designed to have a minimum offset voltage at this common mode input voltage. In the embodiment of FIG. 8, the maximum voltage across the capacitor in the sampling mode is set to one-half the differential voltage of the input signal, similar to the operation of the A/D converter of FIGS. 1–4. However, in the hold mode, the upper plates of the capacitors are shifted to a predetermined voltage minus the initial voltage across the capacitors. This allows the common mode input voltage to the comparator to be set at any desired voltage independent of the common mode voltage of the input signal.

In summary, there has been provided an A/D converter utilizing a fully differential configuration. The maximum voltage across the capacitors in either the positive or negative array is limited to one-half the differential voltage of the input signal. This is achieved by disposing the upper plates of the capacitors in the positive and negative arrays at the common mode voltage of the input signal during the initial sampling step. After redistribution of the capacitor charge, the voltage is centered about a predetermined common mode input voltage.

Although the preferred embodiment has been described in detail, it should be understood that various changes, substitutions and alternations can be made therein without departing from the spirit and scope of the invention as defined by the appended claims.

What is claimed is:

1. A differential analog-to-digital converter, comprising:
    differential amplifier means for receiving a differential input voltage and outputting a signal proportional thereto;
    a positive capacitor array of binary weighted capacitors having a common top plate connected to the positive differential input of said amplifier means;
    a negative capacitor array of binary weighted capacitors having a common top plate connected to the negative differential input of said amplifier means;
    sample means for sampling an analog differential input voltage onto the capacitors in said positive and negative arrays such that the top plates in said positive and negative capacitor arrays have a differential voltage impressed therebetween that is proportional to the analog differential input voltage;
    shift means for shifting the common mode voltage on the top plates of the positive and negative capacitor arrays to a predetermined common mode input voltage for input to said amplifier means; and
    redistribution means for redistributing the charge in the capacitors in said positive and negative arrays to provide a zero differential voltage on the input of said amplifier means in accordance with a successive approximation technique that is responsive to the output signal of said amplifier means to determine the digital value corresponding to the voltage level of the analog differential input voltage.

2. The analog-to-digital converter of claim 1 wherein said sample means comprises:
    first means for connecting the analog differential input voltage to the bottom plates of the capacitors in said positive and negative arrays with the top plates of the capacitors in said positive and negative arrays disposed at a predetermined voltage during a predetermined sample time, said connection means connecting the positive side of said input signal to the bottom plates of the capacitors in said positive array and the negative side of said input signal to the bottom plates of the capacitors in said negative array; and
    second means for connecting a predetermined reference voltage to the bottom plates of each of the capacitors in said positive and negative arrays after said sample time and during a predetermined hold time to shift the top plates of the capacitors in said positive and negative arrays to have a voltage thereacross proportional to said differential input voltage.

3. The analog-to-digital convertor of claim 2 wherein said shift means comprises:
- means for determining the common mode voltage of said analog differential input signal; and
- means for connecting the common mode voltage of the input voltage to the upper plates of the capacitors in said positive and negative arrays during said sample time to provide said predetermined voltage.

4. The analog-to-digital converter of claim 2 wherein said shift means comprises means for limiting the voltage across the capacitors in said positive and negative arrays to one-half the differential voltage of the analog differential input voltage.

5. The analog-to-digital converter of claim 1 and further comprising means to limit the maximum deviation of the common mode input voltage to said amplifier means from said predetermined common mode input voltage.

6. The analog-to-digital converter of claim 5 wherein said means for limiting comprises:
- a first switch connected between the top plates of the capacitors in said positive array and the positive input of said amplifier means;
- a second switch connected between the top plates of the capacitors in said negative array and the negative input of said amplifier means; and
- reset means for selectively connecting the positive and negative inputs of said amplifier means to a predetermined reset voltage; and
- means for opening said first and second switches and activating said reset means prior to the top plates of the capacitors of said positive and negative arrays being disposed at the differential voltage that is proportional to the analog differential input voltage.

7. The analog-to-digital converter of claim 6 wherein said predetermined reset voltage comprises a voltage equal to the predetermined common mode input voltage.

8. The analog-to-digital converter of claim 1 wherein said differential amplifier means has an internal offset voltage associated with the input thereof when disposed at said predetermined common mode input voltage, the analog-to-digital converter further comprising means for compensating the inputs to said differential amplifier means for said offset voltage during redistribution of charge by said redistribution means.

9. The analog-to-converter of claim 2 wherein said means for connecting the predetermined reference to the bottom plates of each of the capacitors in said positive and negative arrays comprises means for connecting the bottom plates of each of the capacitors in said positive and negative arrays to a ground reference.

10. The analog-to-digital converter of claim 9 wherein each of the capacitors in said positive and negative arrays is associated with a bit of an output digital word from the analog-to-digital converter and said redistribution means comprises means for successively connecting the bottom plates of each of the capacitors in said positive and negative arrays to a second predetermined reference voltage in accordance with the successive approximation technique.

11. The analog-to-digital converter of claim 2 wherein each of the capacitors in said positive and negative arrays is associated with a bit of a digital word output by the analog-to-digital converter, said means for connecting a predetermined reference to the bottom plates of each of said capacitors in said positive and negative array comprising means for connecting a first portion of the capacitors in both said positive and negative array to a first reference voltage and connecting the bottom plates of the remaining portion of the capacitors in said positive and negative arrays to a second reference voltage to provide a voltage divider on the top plate thereof.

12. A differential analog-to-digital converter, comprising:
- a differential amplifier having positive and negative differential inputs for receiving the differential input voltage and outputting a voltage proportional thereto;
- a positive capacitor array of binary weighted capacitors having a common top plate connected to the positive differential input of said amplifier;
- a negative capacitor array of binary weighted capacitors having a common top plate connected to the negative differential input of said amplifier;
- switch means for selectively connecting the positive side of a differential analog input signal to the bottom plates of the capacitors in said positive array and the negative side of the differential analog input signal to the bottom plates of the capacitors in said negative array, said first switch means operable during a predetermined sample time;
- means for connecting a voltage equal to the common mode voltage of the differential analog input signal to the top plates of the capacitors in said positive and negative arrays during said sample time;
- second switch means operable during a predetermined hold time after said sample time for connecting a predetermined reference voltage to the bottom plates of the capacitors in said positive and negative arrays; and
- redistribution means for redistributing the charge in the capacitors in said positive and negative arrays to provide a zero differential voltage on the input of said amplified means in accordance with a successive approximation technique that is responsive to the output voltage of said amplifier to determine the digital value corresponding to the voltage level of the analog differential input voltage.

13. The analog-to-digital converter of claim 12 wherein said means for connecting the common mode input voltage of the differential analog input signal to the upper plates of said capacitors in said positive and negative arrays during said sample time, comprises:
- a voltage divider disposed between a positive and negative polarity of the differential input signal with a resistive tap providing one-half of the differential voltage output therefrom, and
- third switch means for connecting the tap of said voltage divider to the upper plates of the capacitors in said positive and negative arrays during said sample time.

14. The analog-to-digital converter of claim 12 wherein said second switch means is operable to connect the bottom plates of the capacitors in said positive and negative arrays to ground during said hold time.

15. The analog-to-digital converter of claim 12 wherein said redistribution means comprising third switch means for selectively connecting a predetermined reference voltage to the bottom plates of the capacitors in said positive and negative arrays in a sequence in accordance with the successive approximation technique to selectively change the voltage on the upper plate of the associated capacitor such that the bits of the digital word corresponding to each of the capacitors can be tested in accordance with the successive approximation technique.

16. The differential analog-to-digital converter of claim 12 wherein said amplifier has an internal offset voltage and further comprising means for offsetting the differential voltage input to said amplifier during said hold mode to compensate for the offset voltage internal to said amplifier.

17. The analog-to-digital converter of claim 12 and further comprising limit circuitry for limiting the range of the maximum absolute value of the voltage that can be applied to either the positive or negative inputs of said amplifier.

18. The analog-to-digital converter of claim 17 wherein said limit circuitry comprises:
first and second reset switches connected between the positive and negative inputs, respectively, of said amplifier and a voltage equal to said predetermined hold reference voltage during said sample time; and
second and third switches connected between the upper plates of the capacitors in said positive and negative arrays, respectively, to selectively disconnect the upper plates of the capacitors in said positive and negative arrays from the positive and negative inputs of said amplifier only during said sample time such that the common mode voltage of said input signal is not input to the positive and negative inputs of said amplifier.

19. A method for analog-to-digital conversion, comprising:
arranging capacitors in a binary weighted configuration in a first and positive array and a second and negative array with the top plates of the capacitors in the positive array being common and the top plates in the negative array being common;
sampling an analog differential input voltage onto the capacitors in the positive and negative arrays such that the top plates in the positive and negative arrays have a differential voltage impressed therebetween that is proportional to the analog differential input voltage;
shifting the common mode voltage on the top plates of the positive and negative capacitor arrays to a predetermined common mode input voltage;
connecting the top plates of the capacitors in the positive and negative arrays to the positive and negative inputs, respectively, of a differential amplifier;
redistributing the charge in the capacitors in the positive and negative arrays to provide a zero differential voltage on the input of the amplifier in accordance with a successive approximation technique that is responsive to the output signal of the amplifier to determine the digital value corresponding to the voltage of the analog differential voltage.

20. The method of claim 19 wherein the step of sampling comprises:
connecting the analog input voltage to the bottom plates of the capacitors in the positive and negative arrays with the top plates of the capacitors in the positive and negative arrays disposed at a predetermined voltage during a predetermined sample time such that the positive side of the input signal is connected to the bottom plates of the capacitors in the positive array and the negative side thereof is connected to the bottom plates of the capacitors in the negative array, the differential input voltage connected such that the positive side thereof is connected to the bottom plates of the capacitors in the positive array and the negative side thereof is connected to the bottom plates of the capacitors of the negative array; and
connecting a predetermined reference voltage to the bottom plates of each of the capacitors in the positive and negative arrays after the sample time and during a predetermined hold time to shift the top plates of the capacitors in the positive and negative arrays to have the voltage thereacross proportional to the differential input voltage.

21. The method of claim 20 wherein the step of shifting comprises:
determining the common mode voltage of the analog differential input signal; and
connecting the common mode voltage of the input voltage to the upper plates of the capacitors in the positive and negative arrays during the sample time to provide the predetermined voltage.

22. The method of claim 19 wherein the step of shifting comprises limiting the voltage across the capacitors in the positive and negative arrays to one-half the differential voltage of the analog input differential voltage.

23. The method of claim 19 and further comprising the step of limiting the maximum deviation of the common mode voltage input to the amplifier from the predetermined common mode input voltage.

24. The method of claim 19 wherein the amplifier has an internal offset voltage associated with the input thereof and disposed at the predetermined common mode voltage, and further comprising compensating the inputs to the amplifier for the offset voltage during redistribution of charge.

* * * * *